(12) United States Patent
Von Kaenel

(10) Patent No.: US 8,882,909 B2
(45) Date of Patent: *Nov. 11, 2014

(54) METHOD FOR PRODUCING VIRTUAL GE SUBSTRATES FOR III/V-INTEGRATION ON SI(001)

(75) Inventor: Hans Von Kaenel, Zürich (CH)

(73) Assignee: Dichroic Cell S.R.L., Padua (IT)

( * ) Notice: Subject to any disclaimer, the term of this patent is extended or adjusted under 35 U.S.C. 154(b) by 2249 days.

This patent is subject to a terminal disclaimer.

(21) Appl. No.: 11/568,469

(22) PCT Filed: May 2, 2005

(86) PCT No.: PCT/IB2005/001204
§ 371 (c)(1),
(2), (4) Date: Oct. 30, 2006

(87) PCT Pub. No.: WO2005/108654
PCT Pub. Date: Nov. 17, 2005

(65) Prior Publication Data
US 2007/0231488 A1    Oct. 4, 2007

Related U.S. Application Data

(60) Provisional application No. 60/567,128, filed on Apr. 30, 2004.

(51) Int. Cl.
| | | |
|---|---|---|
| C30B 25/00 | (2006.01) | |
| C30B 29/42 | (2006.01) | |
| C23C 16/56 | (2006.01) | |
| C23C 16/02 | (2006.01) | |
| H01L 21/02 | (2006.01) | |
| H01L 31/0392 | (2006.01) | |
| H01L 31/0304 | (2006.01) | |
| C23C 16/28 | (2006.01) | |

(52) U.S. Cl.
CPC .......... *H01L 21/0262* (2013.01); *Y02E 10/544* (2013.01); *C23C 16/56* (2013.01); *C23C 16/0272* (2013.01); *H01L 2924/19042* (2013.01); *H01L 2924/10329* (2013.01); *H01L 21/02433* (2013.01); *H01L 21/02381* (2013.01); *H01L 21/02505* (2013.01); *H01L 31/0392* (2013.01); *H01L 21/02463* (2013.01); *H01L 21/0245* (2013.01); *H01L 21/02546* (2013.01); *H01L 31/0304* (2013.01); *C23C 16/0209* (2013.01); *C23C 16/28* (2013.01)
USPC ................. 117/101; 117/84; 117/88; 117/91; 117/94; 117/95; 117/97; 117/99; 117/106

(58) Field of Classification Search
USPC ........ 117/84, 88, 91, 94, 95, 97, 99, 101, 106
See application file for complete search history.

(56) References Cited

U.S. PATENT DOCUMENTS

| | | |
|---|---|---|
| 5,221,413 A | 6/1993 | Brasen et al. |
| 5,659,187 A | 8/1997 | Legoues et al. |

(Continued)

FOREIGN PATENT DOCUMENTS

| | | |
|---|---|---|
| EP | 1 315 199 A1 | 5/2003 |
| EP | 1 513 233 | 3/2005 |
| WO | WO 98/58099 | 12/1998 |

OTHER PUBLICATIONS

Groenert et al, "Monolithic integration of room temperature cw GaAs/AlGaAs lasers on Si substrates via relaxed graded GeSi buffer layers", Journal of Applied Physics, vol. 93, No. 1, (2003), p. 362-367.*

(Continued)

*Primary Examiner* — Matthew Song
(74) *Attorney, Agent, or Firm* — Themis Law

(57) ABSTRACT

Relaxed germanium buffer layers can be grown economically on misoriented silicon wafers by low-energy plasma-enhanced chemical vapor deposition. In conjunction with thermal annealing and/or patterning, the buffer layers can serve as high-quality virtual substrates for the growth of crack-free GaAs layers suitable for high-efficiency solar cells, lasers and field effect transistors.

21 Claims, 6 Drawing Sheets

(56) References Cited

U.S. PATENT DOCUMENTS

| | | | |
|---|---|---|---|
| 6,039,803 | A | 3/2000 | Fitzgerald et al. |
| 6,107,653 | A | 8/2000 | Fitzgerald |
| 6,454,855 | B1 | 9/2002 | Von Kanel et al. |
| 6,537,370 | B1 | 3/2003 | Hernandez et al. |
| 6,635,110 | B1 * | 10/2003 | Luan et al. ............... 117/4 |
| 7,588,954 | B2 * | 9/2009 | Von Kaenel et al. ............ 438/31 |
| 2002/0030246 | A1 | 3/2002 | Eisenbeiser et al. |

OTHER PUBLICATIONS

Ahrenkiel et al., Minority Carrier Lifetime of GaAs on Silicon, J. Electrochem. Soc. (1990), p. 996-1000, vol. 138, No. 3.

Blakeslee, The use of superlattices to block the propagation of dislocations in semiconductors, Mat. Res. Soc. Symp. Proc. (1989), p. 217-27, vol. 148.

Fitzgerald et al., Totally relaxed GexSi1-x layers with low threading dislocation densities grown on Si substrates, Appl. Phys. Lett. (1991), p. 811-13, vol. 59, No. 7.

Li et al., Strain relaxation and surface morphology of compositionally graded Si/Si1-xGex buffers, J. Vac. Sci. Technol. B (1998), p. 1610-15, vol. 16, No. 3.

Hackbarth et al., Alternatives to thick MBE-grown relaxed SiGe buffers, Thin Solid Films 369 (2000), p. 148-51.

Lutz et al., Influence of misfit dislocations on the surface morphology of Si1-xGex films, Appl. Phys. Lett. (1995), p. 724-26, vol. 66, No. 6.

Currie et al., Controlling threading dislocation densities in Ge on Si using graded SiGe layers and chemical-mechanical polishing, Appl. Phys. Lett. (1998), p. 1718-20, vol. 72, No. 14.

Ringel et al., Toward high performance N/P GaAs solar cells grown on low dislocation density P-type SiGe substrates, Photovoltaic Energy Conversion (2003), p. 612-15, vol. 1.

Yang et al., Monolithic integration of III-V optical interconnects on Si using SiGe virtual substrates, J. of Mat. Science: Materials in Electronics (2002), p. 377-80, vol. 13.

Groenert et al., Monolithic integration of room-temperature cw GaAs/AlGaAs lasers on Si substrates via relaxed graded GeSi buffer layers, J. Appl. Phys. (2003), p. 362-67, vol. 93, No. 1.

Rosenblad et al., A plasma process for ultrafast deposition of SiGe graded buffer layers, Appl. Phys. Lett. (2000), p. 427-29, vol. 76, No. 4.

Von Kaenel et al., Fast Deposition Process for Graded SiGe Buffer Layers, Jap. J. Appl. Phys. (2000), p. 2050-53, vol. 39, No. 4B.

Chriqui et al., Room temperature laser operation of strained InGaAs/GaAs QW structure monolithically grown by MOVCD on LE-PECVD Ge/Si virtual substrate, El. Lett. (2003), p. 1658-59, vol. 39, No. 23.

Yang et al., Crack formation in GaAs heteroepitaxial films on Si and SiGe virtual substrates, J. Appl. Phys. (2003), p. 3859-65, vol. 93, No. 7.

Groenert et al., Improved room-temperature continuous wave GaAs/AlGaAs and InGaAs/GaAs/AlGaAs lasers fabricated on Si substrates via relaxed graded GexSi1-x buffer layers, J. Vac. Sci. Technol. B (2003), p. 1064-69, vol. 21, No. 3.

Luan et al., High-quality Ge epilayers on Si with low threading-dislocation densities, Appl. Phys. Lett. (1999), p. 2909-11, vol. 75, No. 19.

Colace et al., Metal-semiconductor-metal near-infrared light detector based on epitaxial Ge/Si, Appl. Phys. Lett. (1998), p. 3175-77, vol. 72, No. 24.

Sutter et al., Thin film photodetectors grown epitaxially on silicon, Solar Energy Materials and Solar Cells 31 (1994), p. 541-47.

Ting et al., Metal-organic chemical vapor deposition of single domain GaAs on Ge/GexSi1-x/Si and Ge substrates, J. Appl. Phys. (2000), p. 2618-28, vol. 87, No. 5.

Rosenblad et al., Epitaxial growth at high rates with LEPECVD, Thin Solid Films 336 (1998), p. 89-91.

* cited by examiner

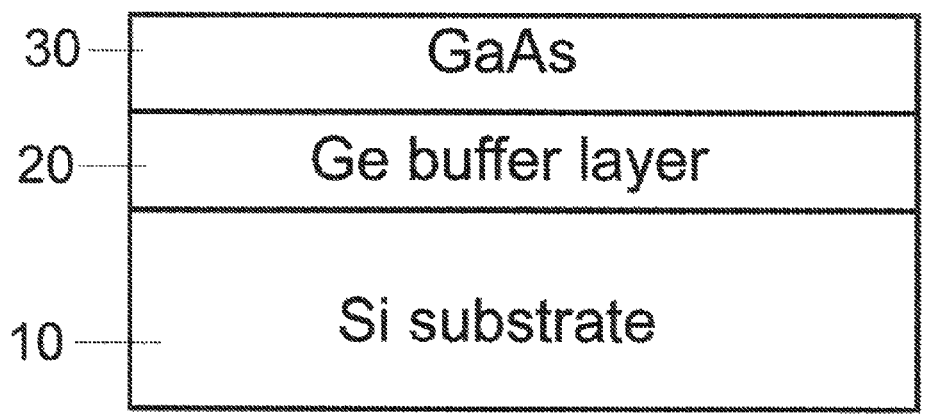
FIG. 1
| Thickness (μm) | 1 | 2 | 3 | 4 | 5 |
|---|---|---|---|---|---|
| Pit density (cm$^{-2}$) | (5.6 ± 0.3) ×10$^7$ | (9.3 ± 0.5) ×10$^6$ | (7.5 ± 0.6) ×10$^6$ | (7.2 ± 0.4) ×10$^6$ | (7.4 ± 0.4) ×10$^6$ |
FIG. 2
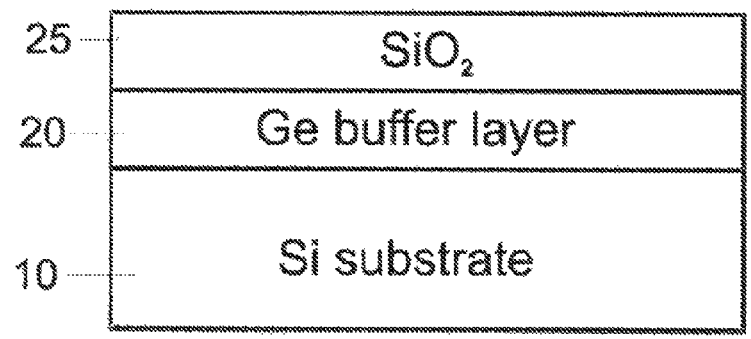
FIG. 3

|  | 1000 suns | | 200 suns | |
| --- | --- | --- | --- | --- |
|  | VS | Ge wafer | VS | Ge wafer |
| $I_{sc}$ (mA) | 176 | 192 | 36 | 40 |
| $V_{oc}$ (mV) | 1121 | 1204 | 1073 | 1161 |
| FF | 77.5 | 79.4 | 81.7 | 84.1 |
| Eff. (%) | 15.3 | 18.3 | 15.1 | 18.7 |

FIG. 9

METHOD FOR PRODUCING VIRTUAL GE SUBSTRATES FOR III/V-INTEGRATION ON SI(001)

The present application is a National Stage of International Application Serial Number PCT/IB2005/01204, filed May 2, 2005, which claims priority to U.S. Patent Application Ser. No. 60/567,128, filed Apr. 30, 2004.

BACKGROUND OF THE INVENTION

There have been many attempts to combine the advantages of large, high quality Si substrates with the superior electronic and optical properties of III/V-compound semiconductors, such as GaAs. Monolithic integration of optoelectronic GaAs devices on Si substrates has been a goal for more than two decades (for a review, see for example Mat. Res. Soc. Symp. Proc. 116 (1989), the content of which is incorporated herein by reference). The 4% lattice mismatch between GaAs and Si induces, however, large defect densities when GaAs is grown epitaxially on Si, leading to greatly degraded properties (see for example Ahrenkiel et al., J. Electrochem. Soc. 137, 996 (1990), the content of which is incorporated herein by reference).

In order to reduce defect densities, various kinds of intermediate buffer layers between the Si substrate and the GaAs layer have been devised. The object of these epitaxial buffer layers is to act as virtual substrates (VS) with a lattice parameter close to that of the GaAs layer.

The lattice parameter of the virtual substrate should thus be larger than that of the Si substrate by about 4%. During epitaxy, a layer normally adapts its lateral lattice parameter to that of the substrate as long as it is sufficiently thin. A buffer layer acting as virtual substrate must therefore be grown beyond the critical thickness for plastic strain relaxation. For strain relaxation to occur, misfit dislocations necessarily have to be present at the substrate/buffer layer interface.

On the other hand, the surface of the buffer layer should be as perfect as possible for the layer to act as a virtual substrate. The most common defects are threading dislocations associated with the process of plastic strain relaxation (see for example Blakeslee, Mat. Res. Soc. Symp. Proc. 148, 217 (1989), the content of which is incorporated herein by reference).

Various ways have been devised to reduce the density of threading dislocations on relaxed buffer layers. One possibility is to use $Si_{1-x}Ge_x$ alloys as buffer layers. This scheme makes use of the miscibility of silicon and germanium over the whole concentration range from x=0 to x=1. Instead of growing an alloy layer with constant composition x, the Ge content is gradually increased from x=0 to some final value $x=x_f$. This grading of the Ge content has been shown to result in lower threading dislocation densities because of diminished dislocation interaction (see for example U.S. Pat. No. 5,221,413 to Brasen et al., and Fitzgerald et al., Appl. Phys. Lett. 58, 811 (1991), the content of which is incorporated herein by reference).

Grading rates have to be kept low in order to guarantee low threading dislocation densities, preferably below 10% per micrometer (see for example Li et al., J. Vac. Sci. Technol. B 16, 1610 (1998), the content of which is incorporated herein by reference). Larger grading rates were, however, preferred for virtual substrates grown by a vapor deposition method known as ultra-high vacuum chemical vapor deposition (UHV-CVD), because of very low growth rates at the low substrate temperature used (see for example U.S. Pat. No. 5,659,187 to Legoues et al., the content of which is incorporated herein by reference). The class of vapor deposition methods generally called physical vapor deposition suffers from the additional problem of source depletion, as is evident in molecular beam epitaxy (MBE) where electron beam evaporators need to be refilled regularly (see for example Hackbarth et al., Thin Solid Films 369, 148 (2000) the content of which is incorporated herein by reference).

Virtual substrates made from graded $Si_{1-x}Ge_x$ buffer layers suffer from two main disadvantages: (1) they require many micrometers of epitaxial growth for grading rates low enough to ensure low threading dislocation densities, (2) their surfaces are relatively rough, being characterized by the so-called cross-hatch morphology associated with the relaxation process (see for example Lutz et al., Appl. Phys. Lett. 66, 724 (1995), the content of which is incorporated herein by reference).

Because of the large layer thickness epitaxial growth is very time consuming for most prior art techniques. In CVD, growth rates can be enhanced substantially only by increasing the substrate temperature. This leads, however, to strongly enhanced surface roughness. UHV-CVD grown buffer layers graded to pure Ge have exhibited rms surface roughness of 210 nm when grown on on-axis Si(001) substrates. Trenches on the cross-hatched surface were found to be as deep as 600 nm (see for example U.S. Pat. No. 6,039,803 to Fitzgerald et al., the content of which is incorporated herein by reference). The trenches were shown to be associated with pile-ups of threading dislocations because of increased dislocation interaction. Somewhat smoother surfaces and fewer pile-ups were observed on off-cut Si substrates. The rms roughness reached, however, 50 nm even in this case, with the deepest trenches still exceeding 400 nm (see for example U.S. Pat. No. 6,039,803 to Fitzgerald et al., the content of which is incorporated herein by reference).

In order to improve the surface quality and lower the threading dislocation density, an intermediate chemical-mechanical polishing (CMP) step after grading to x=0.5 was therefore found to be necessary (see for example U.S. Pat. No. 6,107,653 to Fitzgerald, and Currie, et al., Appl. Phys. Lett. 72, 1718 (1998), the contents of which are incorporated herein by reference). With such a procedure, a surface roughness of 24 nm and threading dislocation (TD) density of $2 \times 10^6$ cm$^{-2}$, sufficiently low for integrating minority carrier III/V devices, could be achieved (see for example Currie et al., Appl. Phys. Lett. 72, 1718 (1998), the content of which is incorporated herein by reference). This TD density was found to be low enough to permit the fabrication of minority carrier devices from GaAs-based material grown on top of such virtual substrates. Examples of such devices are solar cells (see for example Ringel et al., Photovoltaic Energy Conversion, Vol. 1, 612 (2003), the content of which is incorporated herein by reference), and light emitting diodes (see for example V. K. Yang et al., "Monolithic integration of III-V optical interconnects on Si using SiGe virtual substrates", Journal of Materials Science: Materials in Electronics, vol. 13, no. 13 (July 2002) pp. 377-380, the content of which is incorporated herein by reference), and even laser diodes (see for example M. E. Groenert et al., "Monolithic integration of room-temperature cw GaAs/AlGaAs lasers on Si substrates via relaxed graded GeSi buffer layers", Journal of Applied Physics, vol. 93, no. 1 (Jan. 1, 2003) pp. 362-367, the content of which is incorporated herein by reference).

A common feature of all CVD processes is their relatively inefficient use of expensive source gases, most of which leave the reactor without being decomposed and incorporated in the growing layer.

The only prior art technique capable of growing thick graded buffer layers in an economical way is a vapor deposition method known as low-energy plasma-enhanced chemical vapor deposition (LEPECVD) (see for example C. Rosenblad et al., Appl. Phys. Lett. 76, 427 (2000), the content of which is incorporated herein by reference). The application of the method to fast Si homoepitaxy and strained-layer SiGe heteroepitaxy has been described in U.S. Pat. No. 6,454,855 to von Känel et al., and in PCT application No. WO 98/58099 to von Känel et al, the contents of which are incorporated herein by reference.

With LEPECVD, also relaxed buffer layers serving as virtual SiGe substrates can be grown at average rates above 5 nm/s (see for example EP 1 315 199 A1 by von Känel, the content of which is incorporated herein by reference). Epitaxial growth at these rates is possible even at substrate temperatures below 600° C. Surfaces are much smoother than those achievable by other prior art techniques, with rms roughness on the order of 3-4 nm after grading to pure Ge. The cross-hatch is still present, however, although with much reduced maximum height variations of approximately 10 nm (see for example von Känel et al., Jap. J. Appl. Phys. 39, 2050 (2000), the content of which is incorporated herein by reference). This is much below the roughness values measured on CVD-grown buffer layers, such that no CMP process is required for the subsequent epitaxy of III/V-semiconductor layers.

GaAs layers have been grown by vapor deposition method known as metal-organic chemical vapor deposition (MOCVD) onto relaxed SiGe buffer layers graded to pure Ge fabricated by LEPECVD. These layers formed the basis for the first strained InGaAs quantum well laser operating at room temperature at 1.04 µm (see for example European Patent Application No. EP 1 513 233 by von Känel et al., and Chriqui et al., El. Lett. 39, 1658 (2003), the content of which is incorporated herein by reference).

One of the main problems of prior art approaches based on graded buffer layers is that the large layer thicknesses involved, together with different thermal expansion coefficients, favour crack formation upon cooling from the growth temperature to room temperature (see for example Yang et al., J. Appl. Phys. 93, 3859 (2003), the content of which is incorporated herein by reference). Crack formation in the virtual substrate itself can be avoided by grading to a final Ge content below x=1, such that the pure Ge cap is under compressive stress at the growth temperature (see for example M. T. Currie, et al., Appl. Phys. Lett. 72, 1718 (1998), the content of which is incorporated herein by reference). This turned out to be disadvantageous, however, for the growth of GaAs based devices with incorporated strained active layer channels, such as $In_xGa_{1-x}As$. The increased compressive strain imposed on the InGaAs channels by the compressed Ge VS caused these channels to relax by means of misfit dislocations at the GaAs/InGaAs interface. Laser action was therefore obtained in none of these channels, except for the one with the smallest thickness of 5 nm (see for example M. E. Groenert et al., "Improved room-temperature continuous wave GaAs/AlGaAs and InGaAs/GaAs/AlGaAs lasers fabricated on Si substrates via relaxed graded $Ge_xSi_{1-x}$ buffer layers", Journal of Vacuum Science and Technology, vol. 21, no. 3 (May/June 2003) pp. 1064-1069, the content of which is incorporated herein by reference).

Furthermore, the large layer thickness involved in the graded buffer layer approach clearly remains disadvantageous.

There have been several prior art approaches to the fabrication of thinner buffer layers on Si substrates suitable for the subsequent growth of GaAs. One such approach has been to use an amorphous compliant interlayer to relieve the strain in a strontium titanate layer grown epitaxially on Si (see for example US Pat. No. 2002/0030246 A1 to Eisenbeiser et al., the content of which is incorporated herein by reference).

Another approach involves epitaxially depositing layers of pure Ge onto Si substrates. Using atmospheric pressure CVD to first deposit a Ge base layer at low substrate temperature, and then a second Ge layer at higher temperature, one micrometer thick Ge layers with surprisingly low defect densities could be grown (see for example U.S. Pat. No. 6,537,370 to Hernandez et al., the content of which is incorporated herein by reference). These layers were, however, rough and needed chemical mechanical polishing before being useful as virtual substrates. Moreover, because the grown layers were found to be compressively strained, these layers had to be annealed before chemical-mechanical polishing.

A closely related approach was described by Luan et al., using UHV-CVD at much lower growth rates (see Luan et al., Appl. Phys. Lett. 75, 2909 (1999), the content of which is incorporated herein by reference). In this case, a threading dislocation density of $2.3 \times 10^7$ cm$^{-2}$ was observed on 1 µm thick Ge films after repeated temperature cycling. A similar, equally slow procedure with low-pressure CVD was shown to result in smooth surfaces, with rms roughness as low as 0.5 nm (see for example Colace et al., Appl. Phys. Lett. 72, 3175 (1998), the content of which is incorporated herein by reference).

Smooth epitaxial Ge films several micrometer in thickness were also grown by molecular beam epitaxy (see for example Sutter et al., Solar Energy Materials and Solar Cells 31, 541 (1994), the content of which is incorporated herein by reference). This method is, however, well known to be slow too, with growth rates not exceeding a few tenths of nm/s.

LEPECVD has also been used to deposit Ge films thicker than 3 micrometers at rates of 3.5 nm/s, exceeding those of all other prior art techniques. Post-growth annealing was found to reduce the dislocation density as for the examples mentioned above (see von Känel et al., Jap. J. Appl. Phys. 39, 2050 (2000), the content of which is incorporated herein by reference). These Ge layers were, however, grown on exactly oriented Si(001) wafers. They would not be suitable as virtual substrates for GaAs because of the problem of anti-phase domain formation. Indeed, in this prior art approach, no proof was given for the suitability of the Ge layers as virtual substrates for GaAs epitaxy. Moreover, the large thickness of the Ge layers would create a problem of crack formation in a GaAs layer grown on top.

Further reduction of the threading dislocation density has been achieved by artificial patterning of the Ge layers (see for example Luan et al., Appl. Phys. Lett. 75, 2909 (1999), the content of which is incorporated herein by reference). This patterning was done by etching the Ge film all the way done to the substrate, thus exposing the Si surface in between the Ge features. For small enough feature sizes of the order of 10 µm threading dislocations can move to the side walls under the action of thermally induced strain during changes of the substrate temperature, such that they effectively vanish (see for example Luan et al., Appl. Phys. Lett. 75, 2909 (1999), the content of which is incorporated herein by reference).

SUMMARY OF THE INVENTION

Relaxed germanium buffer layers can be grown economically on misoriented silicon wafers by low-energy plasma-enhanced chemical vapor deposition. In conjunction with thermal annealing and/or patterning, the buffer layers can serve as high-quality virtual substrates for the growth of crack-free GaAs layers suitable for high-efficiency solar cells, lasers and field effect transistors.

The invention provides an economical method for growing single crystal buffer layers on top of Si substrates. These buffer layers are suitable as virtual substrates for the subsequent growth of epitaxial compound semiconductor layers, such as GaAs.

It is another object of the invention to provide large epitaxial growth rates of at least 5 nm/s.

It is another object of the invention to use the method of low-energy plasma-enhanced chemical vapor deposition (LEPECVD) to deposit epitaxial Ge films, preferably less than 5 micrometer, and even more preferably less than one micrometer in thickness.

It is another object of the invention to provide a method for using the source gases, germane, trimethyl gallium, trimethyl aluminium, trimethyl indium, and arsine with an efficiency of at least 20%, where the efficiency is defined as the ratio between the number of Ge, Ga, Al or In atoms deposited on the Si substrate per unit time, and the number of Ge, Ga, Al or In atoms entering the growth reactor per unit time.

It is another object of the invention to provide a method for reducing threading dislocation densities by post-growth thermal annealing of the epitaxial Ge layers.

It is another object of the invention to provide a method for further defect reduction by patterning the Ge layer.

It is another object of the invention to provide a method for preventing crack formation in GaAs layers grown onto the virtual Ge substrates.

It is another object of the invention to prevent the propagation of threading dislocations through the epitaxial GaAs layer.

It is another object of the invention to avoid the formation of anti-phase domains in the GaAs layer.

It is another object of the invention to provide a method for fast epitaxial growth of III/V semiconductors.

BRIEF DESCRIPTION OF THE DRAWINGS

Color drawings are present in U.S. provisional application No. 60/567,128 of the same title, the content of which is incorporated by reference hereto and to which priority under the Paris Convention is claimed. The drawings are available for a fee from the US patent office. Black and white drawings of the color drawings are presented herein.

FIG. 1 is a schematic cross-section of an epitaxial layer structure on silicon substrates.

FIG. 2 shows the evolution of threading dislocation densities as a function of Ge layer thickness.

FIG. 3 shows a schematic cross-section of an epitaxial Ge layer with oxide protection for a heterostructure of the invention.

FIG. 9 is a table showing data of solar cells grown on GeVS and bulk Ge wafers.

DETAILED DESCRIPTION OF THE PREFERRED EMBODIMENT(S)

Figure 4:
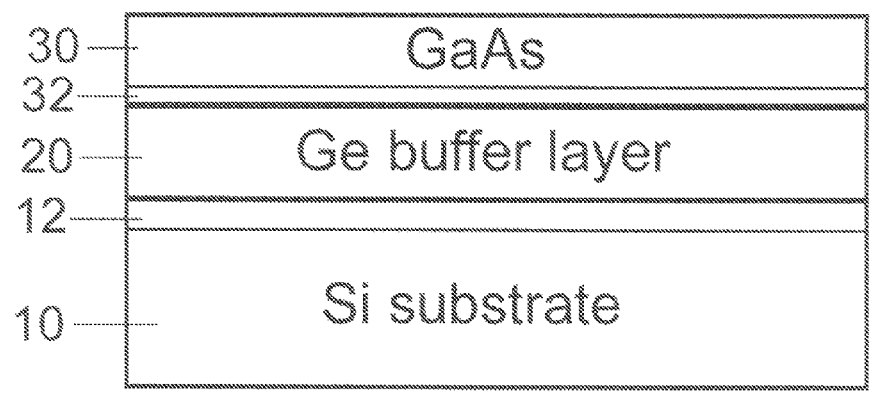
FIG. 4 is another variant of an epitaxial layer structure on silicon substrates.

A first embodiment of the invention is shown in FIG. 1. The surface of a Si wafer 10 is cleaned by a wet chemical treatment or a hydrogen plasma treatment. After loading into the LEPECVD reactor the layout of which has been described for example in U.S. Pat. No. 6,454,855 to von Känel et al., the temperature of the wafer is increased to approximately 600° C. Next, a Ge buffer layer 20 is epitaxially grown by low-energy plasma-enhanced chemical vapor deposition (LEPECVD), preferably at a rate of at least 5 nm/s. The thickness of the Ge layer is preferably chosen to be in the range of 0.75 to 5 μm. It has been shown by high-resolution X-ray diffraction that Ge layers grown in this way are relaxed to 100%. Surface roughness measured by AFM amounts to typically 1 nm rms.

The temperature is then raised to above 700° C., preferably to about 900° C., for about 10 minutes. In another embodiment of the invention the temperature is repeatedly cycled between about 700° C. and 900° C. Such annealing to above 700° C. has been effective in reducing the density of threading dislocations, as determined by etch pit counting, to below $1 \times 10^7$ cm$^{-2}$, while preserving the flatness of the Ge layer. The annealing steps may be carried out in the LEPECVD growth chamber or, preferably, in a separate annealing furnace, such as a rapid thermal annealing (RTA) furnace.

Referring now to FIG. 2, the density of threading dislocations is shown of Ge layers subjected to cycling annealing to 800° C. in the LEPECVD chamber. The results were obtained by wet chemical etching combined with atomic force microscopy and optical interference contrast microscopy for etch pit counting. The substrates 10 used in this study were Si(001) wafers, misoriented by 6 degrees towards a <110> direction. As seen from the figure, annealing to such low temperatures gives rise to a substantial reduction of etch pit densities already.

Referring now to FIG. 3, in another embodiment, the Ge layer 20 is covered with an oxide protection layer 25 before carrying out the annealing steps. A layer of silicon dioxide of a thickness of typically 100 nm has been found to provide sufficient protection against surface roughening during the annealing, such that the annealing temperature can be increased close to the melting point of Ge of 937° C. After the annealing step and before any additional epitaxial growth steps, the oxide protection layer 25 is etched away such as to expose the clean surface of Ge layer 20.

After the annealing steps, the virtual Ge substrate (GeVS), consisting of a Si wafer with epitaxial Ge buffer layer on top, is introduced into a different vacuum chamber equipped for compound semiconductor growth.

A layer of a III/V semiconductor, such as for example GaAs 30, is then epitaxially grown for example by molecular beam epitaxy (MBE) or metal-organic chemical vapor deposition (MOCVD). This layer can be composed of different layers, for example with different doping types and levels, in order to be useful for solar cell or lasers structures.

In a preferred embodiment of the invention, the III/V semiconductor is grown by LEPECVD. The basic system and process as applied to the epitaxy of group IV semiconductors have been described for example in U.S. Pat. No. 6,454,855 to von Känel et al. In the case of a GaAs layer 30 for example, a Ga-containing reactive gas is introduced into the LEPECVD deposition chamber simultaneously to an As-containing gas. As Ga containing gas for example trimethyl-gallium was found to be suitable, while an As-containing gas arsine (AsH$_3$) may be used. In comparison to the MBE and MOCVD techniques LEPECVD has the advantage of providing epitaxial growth rates above 2 nm/s when the plasma is sufficiently dense.

Similar metal-organic precursors may be used for In and Al, such that this embodiment of the invention also allows fabrication of AlGaAs/GaAs and InGaAs/GaAs heterostructures. Doping of the III/V heterostructures may be achieved by introducing doping gases, diluted for example with Ar, into the LEPECVD deposition chamber as described for example in European patent application no. EP 1 315 199 A1 by von Känel.

GaAs layers grown by MBE on VS including Ge buffer layers, deposited on off-cut Si(001) wafers, have been shown to exhibit photoluminescence efficiencies close to GaAs layers on bulk Ge wafers. Both kinds of substrates were off-cut by 6 degrees towards the [110] direction. This resulted moreover in the absence of anti-phase domains.

Another embodiment of the invention is shown in FIG. 4. Here, a Si buffer layer 12 is epitaxially grown by LEPECVD before the Ge layer is deposited. Preferably, layer 12 is grown at lower rate than the Ge layer, for example below 1 nm/s. The Si layer may be less than 100 nm thick, and it may be grown at higher temperature than the Ge layer. Such a Si interlayer has been shown to be useful in improving the crystal quality of the Ge buffer layer.

It may also be preferable to introduce a GaAs interlayer 32 before layer 30 is grown. This interlayer 32 is preferably grown at a lower temperature than layer 30. Layer 32 may be effective in preventing threading dislocations from the Ge buffer layer 20 to penetrate into the GaAs layer 30.

Figure 5:
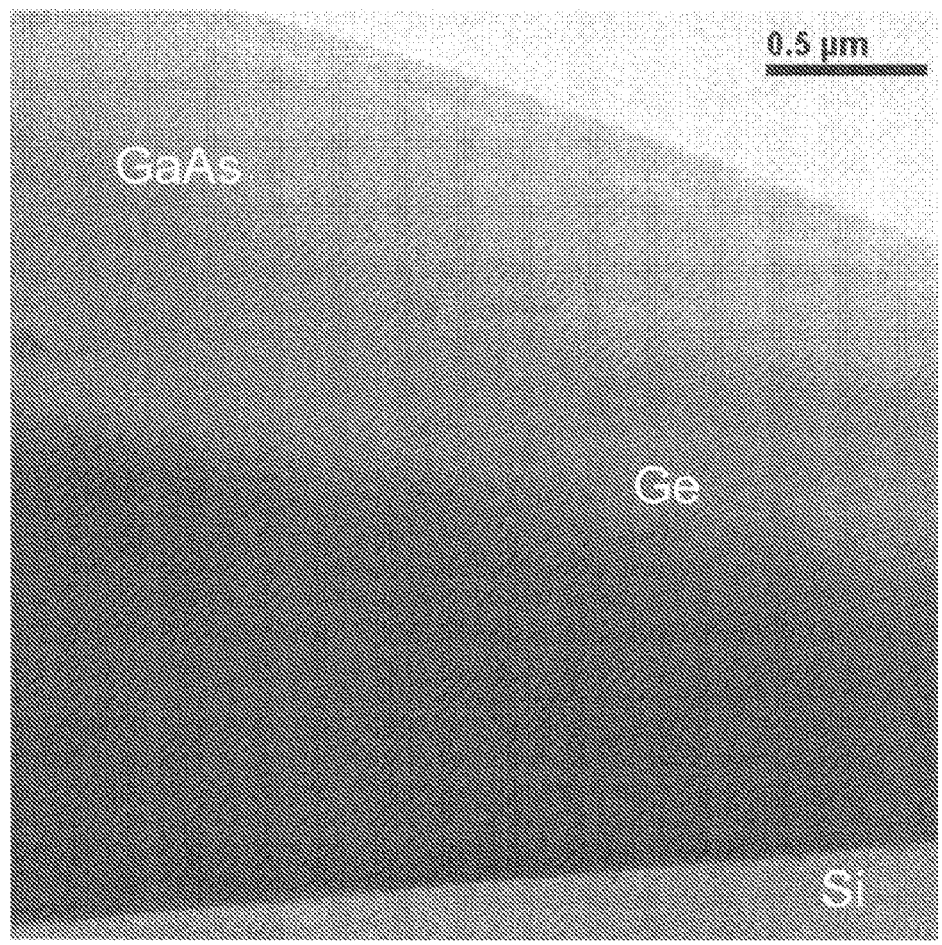
FIG. 5 is a transmission electron image of a cross-section of an epitaxial GaAs/Ge heterostructure on Si.

The GaAs interlayer 32 can for example be grown by MBE at a substrate temperature below 500° C. FIG. 5 shows a transmission electron microscopy image of a cross-section through a structure similar to that of FIG. 4. Alternatively, interlayer 32 may be grown for example by atomic-layer epitaxy (ALE), where Ga and As are supplied sequentially, resulting in a Ga/As superlattice.

Figure 6:
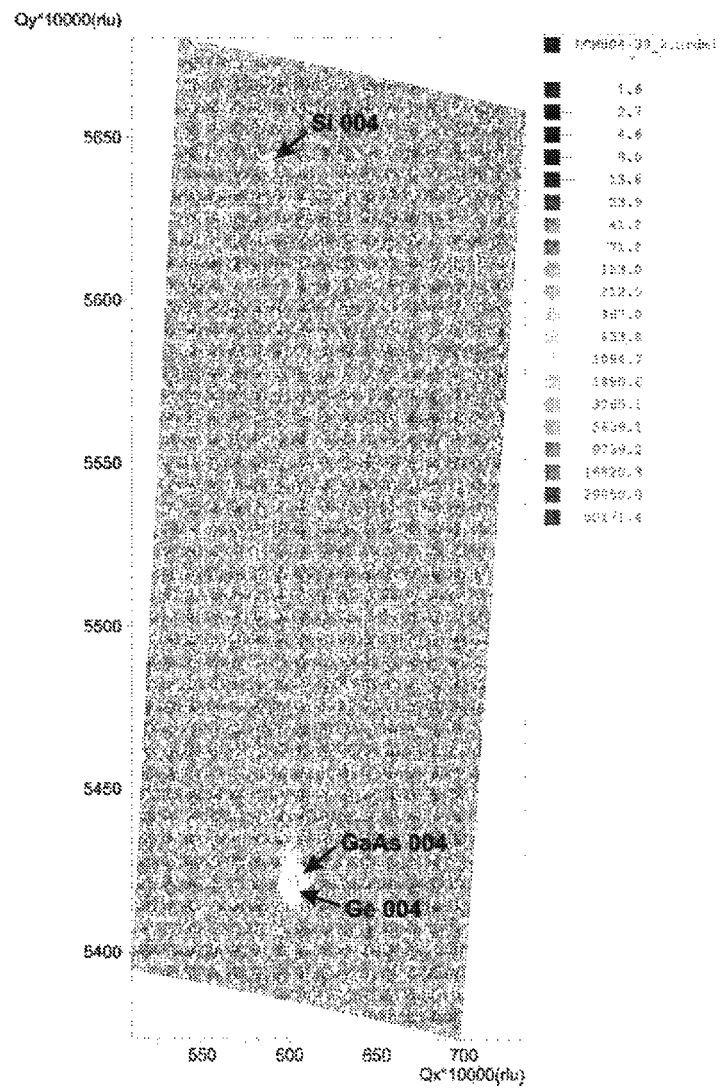
FIG. 6 is a reciprocal space map obtained by high-resolution X-ray diffraction on a GaAs/Ge/Si(001) heterostructure.

The excellent crystal quality of the Ge buffer layers grown according to the invention can be judged also from reciprocal space maps obtained by high-resolution X-ray diffraction. FIG. 6 shows the reciprocal space region around the symmetric (004) reflection. Here, $Q_x$ is the reciprocal space coordinate parallel to the substrate surface, and $Q_y$ the coordinate perpendicular to the surface. At large $Q_y$ the Si substrate reflection may been seen, while the GaAs and Ge reflections occur at lower $Q_y$. There is hardly any diffuse scattering in between the sharp reflections, proving the excellent quality of the Ge and GaAs layers.

Figure 7:
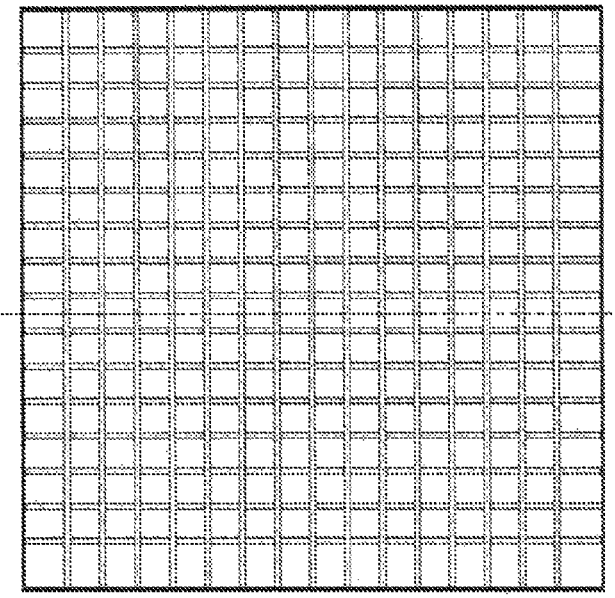
FIG. 7 is a plan view of part of a patterned Ge buffer layer with a square grid of grooves.
Figure 8:
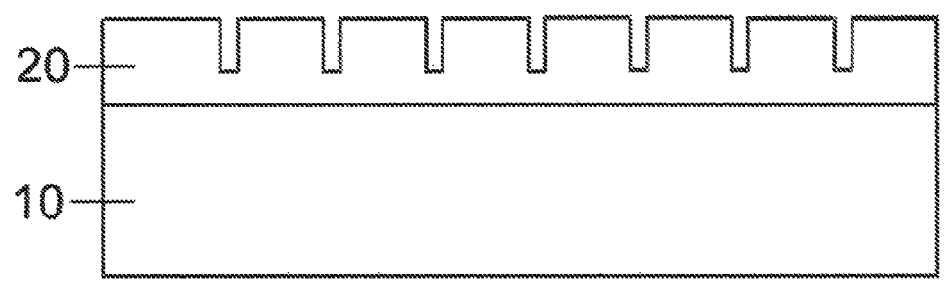
FIG. 8 is a cross-section of a patterned Ge buffer layer.

Referring to FIG. 7 in another embodiment of the invention, the Ge layer 20 in FIG. 1 and FIG. 4 is patterned prior to growing layers 30 and 32. The patterning can for example be made by a square array of grooves as shown in plane view in FIG. 7 and in a cross-section along the dashed line (see FIG. 7) in FIG. 8. Parallel grooves have a spacing of approximately 10 to 20 μm. The depth of the grooves is less than the thickness of layer 20 in FIG. 1 and FIG. 4, unlike that described in Luan et al., Appl. Phys. Lett. 75, 2909 (1999), where the etching of the Ge film is performed all the way done to the substrate, thus exposing the Si surface in between the Ge features. The grooves are preferably 1 to 2 micrometer wide. They can be defined for example by photolithography, followed by wet-chemical etching. Alternatively, a mask suitable for a subsequent wet-chemical etching step may be formed by a printing process, where a polymer resistant to the etching solution is applied by a stamp. It should be emphasized that the patterning is not restricted to the kind outlined in FIG. 7. As long as relevant feature sizes do not exceed a critical size of the order of 10-20 μm, and as long as the spacing between the features is not too large (a few micrometers at most), any pattern will result in a reduction of threading dislocation densities.

After the patterning of layer 20 an annealing step to temperatures above 700° C. is carried out, preferably up to approximately 900° C. The annealing step can also be repeated by temperature cycling, preferably between 700° C. and 900° C. It is expected that threading dislocations moving under the action of thermally induced stress will move to the grooves, where they may recombine. This will result in threading dislocation densities far below those of planar Ge buffer layers.

Referring again to FIG. 1 and FIG. 4, in another embodiment of the invention, layer 30 consists of a layer of GaAs to which a small amount of In has been added. The In concentration is kept low, preferably on the order of 1 percent. The added In results in a compressive strain of layer 30 at the substrate temperature used for MBE, MOCVD or LEPECVD growth. This compressive strain compensates for the tensile strain normally induced in layer 30 during cooling to room temperature. Crack formation in layer 30 can be entirely avoided in this way. The added In, being of low concentration, results in minor changes of the electronic properties of layer 30. These changes can be further reduced by adding the In only in part of layer 30, such that the electrically active part continues to consist of pure GaAs.

It has to be emphasized that layer 30 need not always be a homogeneous layer. By contrast, layer 30 may be composed of several sub-layers which can for example be differently doped. It may also contain quantum well layers or quantum dot layers, as are known to be useful for microelectronic and optoelectronic applications. In particular, layer 30 may contain the active region of high-efficiency solar cells. Layer 30 may also contain the active region of quantum well and quantum dot lasers. Alternatively, layer 30 may contain the active regions of modulation-doped field effect transistors.

FIG. 9 is a table comparing data obtained on GaAs solar cells grown on Ge VS and bulk Ge wafers, respectively. The solar cells have been grown by MOCVD and processed with standard procedures used for high efficiency solar cells for space applications. No final antireflective coating has, however, been applied. The 1 mm$^2$ square cells were illuminated by AM 1.5 illumination at two different levels of concentration. According to FIG. 9, there is some loss in short circuit current $I_{sc}$, open circuit voltage $V_{oc}$ and fill factor FF when upon using Ge VS instead of bulk Ge wafers. The gains offered by much lower fabrication costs may, however, outweigh the loss of performance.

It must also be emphasized that the deposition conditions in the LEPECVD reactor (mass flows of the reactive gases, shape and density of the plasma column, arc discharge current and voltage) can be chosen in such a way as to optimize the usage of expensive source gases, such as germane, methyl gallium and arsine. It has been shown that a gas usage factor GUF above 20% can be attained by LEPECVD. Here, GUF is defined as the number of Ge atoms deposited on the substrate per unit time, divided by the number of Ge atoms entering the reactor per unit time.

The relatively small thickness required for Ge buffer layers deposited directly onto Si wafers, together with the high GUF, render LEPECVD a profitable technology for virtual Ge substrate production.

In an advantage, the invention provides an economical method of growing relaxed germanium buffer layers on a misoriented Si(001) substrate.

In another advantage, the invention provides an economical method for growing single crystal buffer layers on top of Si substrates which are suitable as virtual substrates for the subsequent growth of epitaxial compound semiconductor layers, such as GaAs.

In another advantage, unlike the approach described in U.S. Pat. No. 6,537,370 to Hernandez et al, which resulted in the growth of layers which were rough and needed chemical mechanical polishing before being useful as virtual substrates and further requiring annealing before chemical-mechanical polishing, the Ge layers grown by the process of the invention do not require any annealing to relax, nor is any chemical mechanical polishing step needed to reduce surface roughness.

In another advantage, the invention provides a means for reducing the threading dislocation density by artificial patterning of the Ge layers in a manner which does not require etching the Ge film all the way done to the substrate, thus avoiding exposure of the Si surface in between the Ge features.

Multiple variations and modifications are possible in the embodiments of the invention described here. Although certain illustrative embodiments of the invention have been shown and described here, a wide range of modifications, changes, and substitutions is contemplated in the foregoing disclosure. In some instances, some features of the present invention may be employed without a corresponding use of the other features. Accordingly, it is appropriate that the foregoing description be construed broadly and understood as being given by way of illustration and example only, the spirit and scope of the invention being limited only by the appended claims.

What is claimed is:

1. A method of growing gallium arsenide layers (GaAs) on relaxed germanium buffer layers on a misoriented silicon substrate comprising:
   cleaning a surface of a Si wafer by a wet chemical treatment or a hydrogen plasma treatment;
   loading the Si wafer into a low-energy plasma-enhanced chemical vapor deposition (LEPECVD) reactor;
   increasing temperature in a LEPECVD reactor to approximately 600° C.;
   epitaxially growing a Si buffer layer less than 5 µm thick on the Si wafer by LEPECVD;
   epitaxially growing a Ge buffer layer by LEPECVD on the Si buffer until a thickness of the Ge buffer layer is reached within a range of 0.75 to 5 µm, thereby relaxing the Ge buffer layer and reducing surface roughness measured by AFM amounts to typically 1 nm rms; and
   annealing a resulting heterostructure by raising the temperature to above 700° C. either in the LEPECVD reactor or in a separate annealing oven, for about 10 minutes;
   loading the Si wafer into another deposition chamber; and growing a layer of GaAs using a vapor deposition method.

2. The method of claim 1, wherein annealing the heterostructure comprises repeatedly cycling the temperature between about 700° C. and 900° C. in order to reduce the density of threading dislocations while preserving the flatness of the Ge layer.

3. The method of claim 1, wherein the Ge buffer layer is covered with an oxide protection layer before carrying out the annealing step, and wherein, after the annealing step, the oxide layer is again removed.

4. The method of claim 1, wherein the oxide protection layer is a layer of silicon dioxide of a thickness of typically 100 nm.

5. The method of claim 1, wherein the Si buffer layer is grown at lower rate than the Ge layer.

6. The method of claim 1, wherein a GaAs interlayer is introduced before the GaAs layer is grown, thereby helping to reduce the number of threading dislocations that penetrate from the Ge buffer layer into the GaAs layer.

7. The method of claim 6, wherein the interlayer is grown by atomic-layer epitaxy (ALE), where Ga and As are supplied sequentially, resulting in a Ga/As superlattice.

8. The method of claim 6, wherein the Ge layer is patterned prior to growing the GaAs layer and the GaAs interlayer.

9. The method of claim 8, wherein the patterning is made by a square array of grooves or in parallel grooves having a spacing of approximately 10 to 20 µm.

10. The method of claim 9, wherein the depth of the grooves is less than the thickness of the Ge layer.

11. The method of claim 9, wherein the grooves are 1 to 2 micrometer wide.

12. The method of claim 8, wherein the patterning is composed of grooves defined by photolithography, followed by reactive ion etching, and wherein a polymer acts as an etch mask.

13. The method of claim 8, wherein the patterning is composed of grooves defined by photolithography, followed by wet-chemical etching.

14. The method of claim 8, wherein the patterning is composed of grooves defined by a mask suitable for a subsequent wet-chemical etching step may be formed by a printing process, where a polymer resistant to the etching solution is applied by a stamp.

15. The method of claim 8, wherein the patterning includes features in which feature size does not exceed a critical size of the order of 10-20 µm, and wherein spacing between features is on the order of a few micrometers, in order to produce a pattern resulting in reduction of threading dislocation densities.

16. The method of claim 8, wherein after the patterning of the Ge layer, an annealing step to temperatures above 700° C. is carried out, in order to induce movement of the threading dislocations into the grooves.

17. The method of claim 8, wherein the annealing step is repeated by temperature cycling, in order to induce movement of the threading dislocations into the grooves.

18. The method of claim 1, wherein the GaAs layer comprises a layer of GaAs to which a small amount of In has been added, wherein the In concentration is kept low, resulting in a compressive strain of the GaAs layer at the substrate temperature used for MBE or MOCVD growth.

19. The method of claim 18, wherein the layer of GaAs contains quantum well layers or quantum dot layers, as are known to be useful for microelectronic and optoelectronic applications, an active region of high-efficiency solar cells, an active region of quantum well and quantum dot lasers, or an active regions of modulation-doped field effect transistors.

20. The method of claim 1, wherein the GaAs layer of the step of growing the layer of GaAs using a vapor deposition method comprises different layers, such to be suited for solar cell or lasers structures.

21. The method of claim 1, wherein the GaAs layer comprises a plurality of sub-layers which are doped differently.

* * * * *